United States Patent [19]

Wilder

[11] Patent Number: 5,182,567
[45] Date of Patent: Jan. 26, 1993

[54] RETROFITTABLE VAPOR SOURCE FOR VACUUM METALLIZING UTILIZING SPATTER REDUCTION MEANS

[75] Inventor: Harold J. Wilder, Bay Village, Ohio

[73] Assignee: Custom Metallizing Services, Inc., Bay Village, Ohio

[21] Appl. No.: 714,581

[22] Filed: Oct. 12, 1990

[51] Int. Cl.[5] ............................ C23C 14/00; B01B 7/00
[52] U.S. Cl. ...................................... 392/389; 118/726
[58] Field of Search ................ 392/388, 389; 118/726, 118/725, 724, 719; 427/55

[56] References Cited

U.S. PATENT DOCUMENTS

| 4,264,803 | 4/1981 | Shinko | 392/389 |
| 4,373,952 | 2/1983 | Parent | 252/520 |
| 4,446,357 | 5/1984 | Barshter | 392/389 |
| 4,526,840 | 7/1985 | Jerabek | 118/726 |

FOREIGN PATENT DOCUMENTS

| 1389581 | 1/1964 | France | 118/726 |
| 60-116771 | 6/1985 | Japan | 118/726 |
| 208408 | 12/1967 | U.S.S.R. | 392/389 |
| 476342 | 7/1975 | U.S.S.R. | 118/726 |

Primary Examiner—Bruce A. Reynolds
Assistant Examiner—John A. Jeffery
Attorney, Agent, or Firm—Donald A. Bergquist

[57] ABSTRACT

A metal vapor evaporator source is provided that increases productivity of a vacuum plating operation in which it is used by reducing scrap product due to spatter of liquid metal particles from the evaporator to the product, and by reducing spurious metal condensate within the vacuum chamber, the accumulation of which metal condensate is known to increase downtime of the equipment. The former is accomplished by inhibiting the generating of such particles by increasing the total pressure on the pool of molten metal and by physically intercepting many of the spattered particles that are generated despite the increased pressure. The latter is accomplished by partially collimating the beam of metal vapor, a result of intercepting and condensing the stray vapor on a radiant-heat shield that is at a temperature above the melting point of the metal.

14 Claims, 3 Drawing Sheets

RETROFITTABLE VAPOR SOURCE FOR VACUUM METALLIZING UTILIZING SPATTER REDUCTION MEANS

INTRODUCTION

This invention relates to the field of vacuum metallizing, a long-known process whereby metals are deposited onto substrates by evaporation from the molten state in vacuum, vacuum being used principally to lengthen the mean free path of the metal vapor molecules as well as to prevent oxidation thereof. More specifically, this invention provides, for use in vacuum metallizing, a metal vapor source having a high vaporizing rate with reduced spitting, thereby allowing higher production rates of a top quality metallized product, while also providing less spurious metal condensate within the vacuum chamber, thereby to increase the service life of the chamber between cleanings to also effect higher production rates.

BACKGROUND

Vacuum metallizing is a process that has a long history. U.S. patents issued to inventors who have gained great fame are present in pior art relating to this general field of technology—inventors such as Thomas A. Edison and Clarence Birdseye.

In general, this technology takes several forms. All forms require a vacuum chamber capable of producing reduced pressures in the range of $10^{-4}$ Torr (1 Torr=1/760 atmospheres pressure). The chamber may have fixed targets or substrates to be metallized in what might be called a product batch process, wherein the targets are removed after they are coated; or it may have a spooled web of finite length that is uncoiled as it passes over the metal vapor source to be wound on a takeup spool in what might be called a product semi-continuous process because the process must be stopped to change out the spools. The metal vapor source may be a batch device, wherein an intitial charge of metal is vaporized without being replenished (i.e., a source batch process), or it may be an evaporating source having a continuous supply of metal (i.e., a source continuous process), usually fed in the form of a continuous wire.

An ideal process would combine a source continuous process with a true product continuous process, wherein a continuous web of substrate material passes into the vacuum chamber, is exposed to a source continuous process therein, and exits the vacuum chamber as a coated web product. This technology is not now broadly available.

This invention is primarily directed to improving the overall production rate and efficiency of a source continuous, product semi-continuous, vapor depositing process while using existing commercial vapor plating equipment; in other words, retrofittable into the installed capacity of the industry. The disclosure is not to proscibe the use of this invention in other processes, but to point to the overall process wherein the teachings of this invention will be most efficacious.

A part of improving the overall production rate of such a process is the task of maintaining the cleanliness of the vacuum chamber, especially owing to the fact that spurious metal condensate within the chamber tends to have extremely high surface area that is capable of adsorbing inordinate amounts of atmospheric gases and vapors whenever the chamber is opened. These adsorbed gases and vapors add to the pumping load required to achieve the high vacuum required to operate the process, thereby they increase the pump-down time that is a part of the down time of the equipment, which increase adversely affects the overall production rate of the equipment. Thus, it can be seen that reducing spurious metal condensate within the vacuum chamber is a desirable end.

The equipment in the commercial vapor plating industry today is evaporator limited. That is to say, the rate of evaporation from the evaporators currently in use limits the production rate of the equipment. The limit is created by a phenomenon called "spitting", wherein particles of molten metal are emitted from the molten pool of metal and the particles strike the product substrate, thereby creating an unacceptable product. Spitting may be caused by evaporation of metal at the interface between the molten pool of metal and the containment boat, which is also the heating element. In aluminum vapor plating operations, spitting appears to begin occurring as the evaporation flux reaches approximately 0.059 g/cm$^2$/min (i.e., 3.8 g/in$^2$/min). Thus, although the present web handling equipment, the wire feed equipment, and the power supply equipment are all capable of allowing production rates up two to four times the present capacity of the existing equipment, the spitting phenomenon effectively limits the capacity of the process equipment. Most commercial equipment, therefore, operates at a maximum rate in the range of 0.031 g/cm$^2$/min to 0.059 g/cm$^2$/min (i.e., 2.0 to 3.8 g/in$^2$/min). Thus, it would be a clear improvement to increase the evaporation flux level that results in spitting or to otherwise reduce or eliminate the effects of spitting on the product quality. It is known that the onset of spitting is also affected by the operating pressure; higher pressures inhibit spitting. Thus, in practice, the operating pressure is a variable that is subject to compromise; lower pressures result in a cleaner vacuum chamber by increasing the efficiency of deposition on the target by lengthening the mean free path of the metal molecules. Shortened mean free path, resulting from higher vacuum chamber pressures leads to increased spurious condensation as well as raising issues of oxidation or other reactions with the residual gases in the chamber, leading to potentially reduced product quality.

The evaporator boats that are used in common commercial practice today are both containment vessel and heating element. Typically, an evaporator boat comprises a heating element with a cavity hollowed out of it to provide a well for the metal to be evaporated. The material of which the heating element is made must be an electrical conductor having suitable resistivity. Often intermetallic compounds of titanium diboride (TiB$_2$) and boron nitride (BN) in binary mixture are used and occasionally in ternary mixture with aluminum nitride (AlN). Small quantities of tungsten or calcium compounds might also be included (as in U.S. Pat. No. 4,373,952, 1983, Parcut, and U.S. Pat. No. 4,526,840, 1985, Jarabek). The heating element must be resistant to the corrosive and erosive effects of the metal in both the molten and vapor states. Sometimes this chemical resistance is provided by means of a resistant coating (as in U.S. Pat. No. 4,264,803, 1981, Shinko).

From the foregoing paragraph, it can be seen that the evaporation source in common commercial use is an article with many functions, and therefore must require a comprise of some properties to achieve others. It is clear that if the functions of the existing evaporator could be provided by separate entities, the physical and chemical properties of each entity could be optimized to more effectively perform the specific function assigned to the entity. The resulting evaporator may be more complex, being assembled from multiple entities or pieces, but if it may be retrofitted into the existing commercial equipment and if it increases the productivity of that equipment, it will clearly advance the state of the art.

SUMMARY OF THE INVENTION

Therefore, it is an object of this invention to provide a metal vapor evaporator source that is fully retrofittable into the majority of the installed capacity of commercial vapor plating equipment existing today, said source, by virtue of its restricted metal vapor outlet, maintains an elevated pressure within the molten metal containment portion thereof, thereby supressing spitting of metal droplets.

It is also an object of this invention to provide such a retrofittable metal vapor evaporator wherein a large majority of such metal droplets produced by spitting from the molten metal surface are physically barred from contacting the workpiece being plated.

It is also an object of this invention to provide such a retrofittable metal vapor evaporator that provides a restricted (i.e., partially collimated) beam of molecular metal directed toward the workpiece being plated, thereby to reduce significantly any extraneous condensing of metal vapor within the vacuum chamber, thereby to reduce downtime of the chamber for cleaning operations.

It is also an object of this invention to provide such a retrofittable metal vapor evaporator wherein radiant heat loss is reduced by means of a thermal radiation shield having a slotted portion that contributes to the collimation of the molecular beam and contributes to protecting the workpiece from spattered metal droplets, which shield has an open bottom that prevents the accumulation therein of molten metal.

DETAILED DESCRIPTION OF THE INVENTION

This invention will best be understood by referring to the attached drawings, wherein various parts are identified by number, which numbers are consistent throughout the set of drawings.

Figure 1:
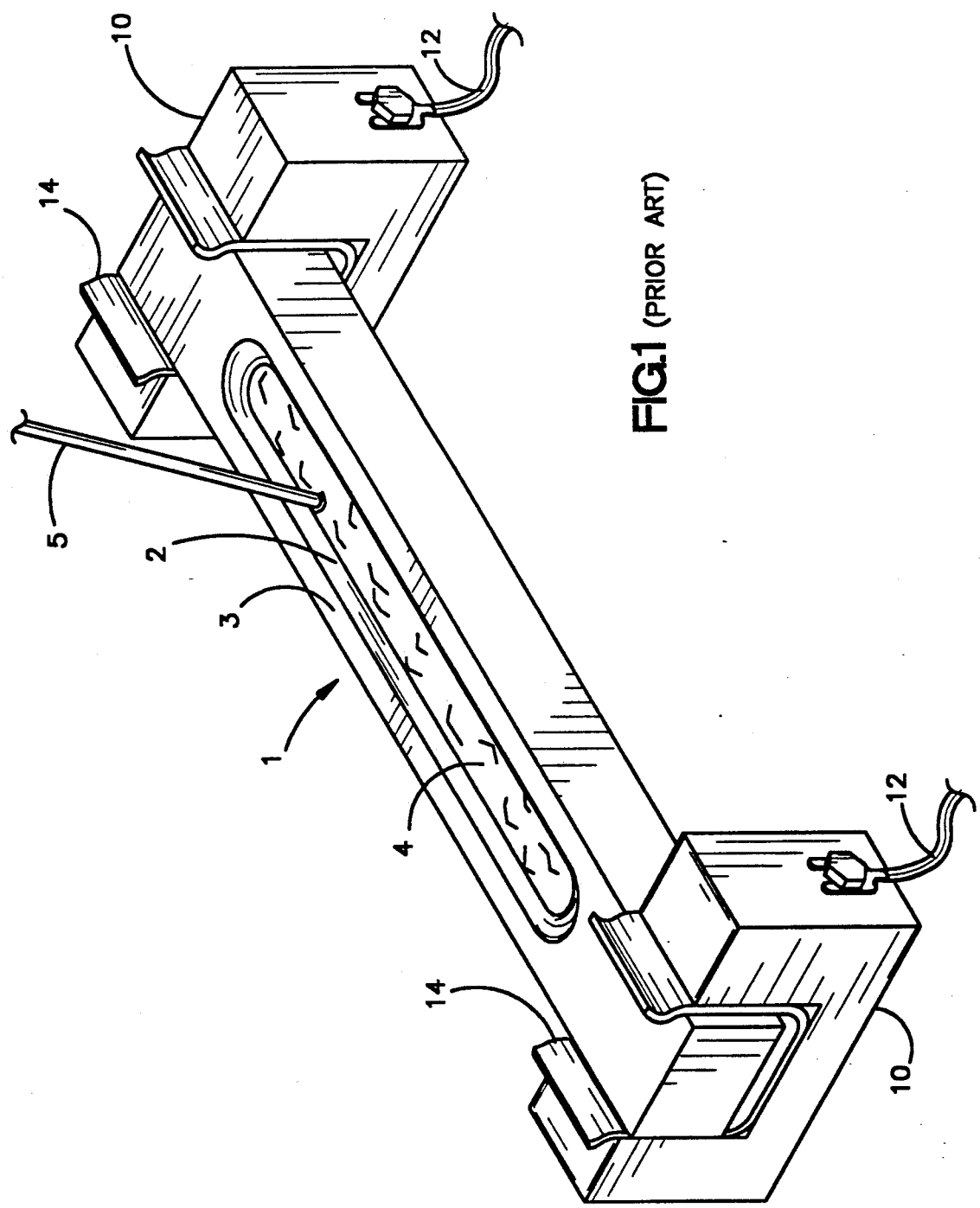
FIG. 1 illustrates the typical prior art metal vaporizing boat with the typical physical support and electrical contact means therefor.

In FIG. 1, the illustration of prior art, the typical open evaporator boat 1 is shown as an electrically resistive bar of substantially rectangular cross section with an elongated well 2 in the top surface 3 thereof to contain a pool 4 of molten metal to be evaporated. The metal in the well is replenished by means of a continuous wire fed into the well by mechanical means not shown. Each end of the prior art boat 1 is supported in a water-cooled metal "arm chair contact" 10 to which electrical cables 12 from a suitable controllable power source (not shown) are attached. As can be seen in the figure, an arm chair contact 10 is a contact wherein both physical support and electrical contact are provided by, in combination, a substantially horizontally disposed planar face of a "seat", upon which the bottom surface of an end portion of an evaporator boat may rest, and two opposing substantially parallel vertically disposed planar faces of bodies attached to the seat, between which opposing faces, or "arms", said end portion of said evaporator boat may be inserted with the side surfaces thereof in compressive contact with the respective said planar surfaces. The seat and arms are disposed in a manner resembling the seat and the arms of an armchair. To ensure good electrical contact between the boat 1 and the arm chair 10, a compressible layer 14 of flexible graphite is interposed between them as the boat 1 is slipped into the arm chair 10. Flexible graphite is a commercially-available product made by compressing vermicular graphite into the form of a sheet. One manufacturer, Union Carbide Corporation, sells such a product under the trade name GRAFOIL ®.

It should be noted from the description of FIG. 1 that the boat must be capable of serving a variety of functions; it must at once be a resistive heating element, a high-temperature structural support, and a container resistant to the chemical attack of molten metal at its boiling point. Typical materials for such boats are refractory ceramic materials.

Although the science should be lauded for producing suitable materials for such multi-functional use, it stands to reason that a more desirable system might result if the various functions could be separated to most advantageously use specific materials for their optimal properties. Thus an optimal heating element would be used in combination with an optimal physical containment vessel supported by optimal mechanical support materials. It is precisely this concept that produced the present invention.

In addition, although radiant heat shields have been used in high-temperature vacuum applications before, the heat shield used in this invention has features that make it of special value in this invention. The heat shield, in combination with the metal vapor source of this invention, result in a superior operating system capable of producing results not anticipated by any prior art seen by the applicant.

Figure 2:
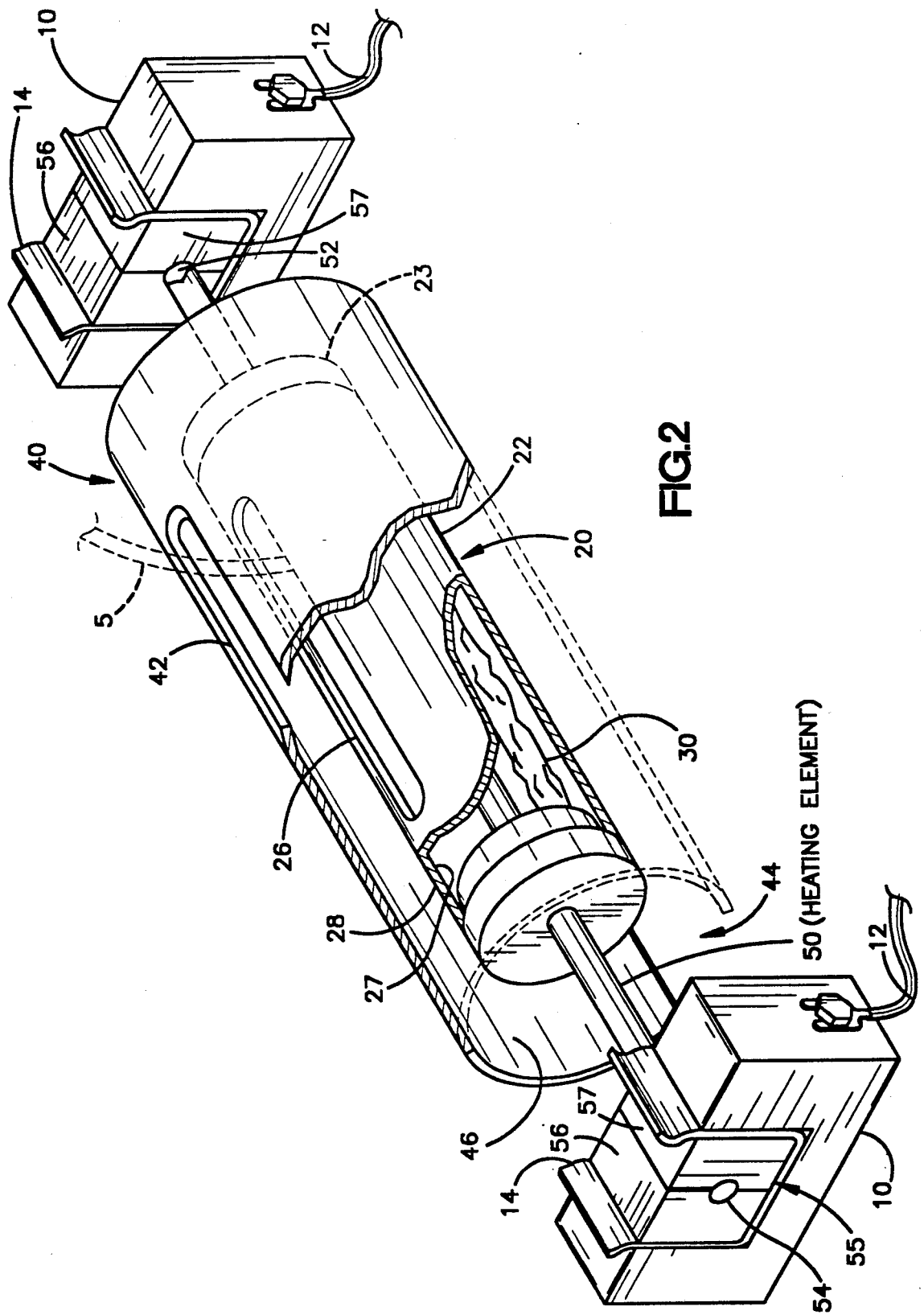
FIG. 2 illustrates the present invention in partial cutaway view.

FIG. 2 shows the present invention in the best mode thereof. A substantially closed container 20 is formed from a cylinder 22 with an end plug 23 on each end thereof. The cylinder must be capable of containing therein molten metal to be vaporized and the vapor emitted therefrom. The cylinder 22 is to be formed of chemically resistant refractory materials. Materials that are suitable are aluminum nitride (AlN), boron nitride (BN), silicon nitride ($Si_3N_4$), titanium diboride ($TiB_2$), or perhaps refractories made from mixtures thereof. Note that there is no need for the container 20 to be electrically conductive, nor need it be non-conductive. In the best mode, the cylinder 22 would be made from titanium diboride ($TiB_2$), which is especially desirable for use in aluminum vaporizing because it is easily wetted by molten aluminum. Thus, as aluminum is vaporized from the pool of liquid metal, some of it may condense on or be spattered onto the internal walls of the container, thereby forming a secondary metallic vapor source in addition to the pool of liquid metal. Thus, the area from which metal may evaporate is increased by a factor of three or more, especially in the embodiment employing a central heating element as shown in FIG. 2.

The end plugs 23 on the cylinder must also be formed of chemically resistent refractory materials. Materials that are suitable are boron nitride (BN) or aluminum nitride (AlN). It is preferred in the best mode that the end plugs 23 be made of an electrically insulating material with good thermal conductivity; in the best mode boron nitride is the material of choice.

A vapor outlet 26 is provided in the container. In the best mode, the vapor outlet 26 is an elongated passage through the thickness of the cylinder wall 28 and parallel to the axis of the cylinder, it is not intended that this description proscribe multiple outlets, non-elongate outlets, nor diagonal or transverse outlets. The vapor outlet 26 is also to be used as the opening into which additional metal is to be added to the molten pool 30 by means of a substantially continuous wire 5 of the vaporant metal, the wire being fed from a spool or other storage device, not shown.

It is anticipated that, although the container thus far described would function as a vapor source if an adequate heat source were provided, excessive heat loss by radiation will be present from the container thus described were it to be operated at the elevated temperatures required to vaporize metals, making performance far from optimal.

In the best mode, then, a shield is to be provided that will significantly improve the thermal efficiency of the vapor source. Although a multi-layered radiant heat shield may appear to be desired in an application such as this, a practical approach is obtained by the use of a single-layer radiant heat shield 40 surrounding the container 20 and spaced away from it. Thus, the complexity of the heat shield is reduced and additional material that may adsorb atmospheric gases is minimized, thereby not significantly adding to pump-down time that translates to equipment down time.

In the best mode, the heat shield 40 is to be made from silicon carbide. Applicant is aware of a new process, now still proprietary, wherein such shapes can be readily made by converting a carbonaceous product of substantially any desired shape into substantially pure silicon carbide without the shape suffering any significant deterioration. Other materials that have been contemplated for the heat shield are graphite, GRAFOIL®, titanium diboride (TiB$_2$), silicon nitride (Si$_3$N$_4$). A good second-choice material, especially for use in aluminum vapor plating operations, would be aluminum nitride for reasons that it will readily wet with aluminum, it will not conduct electricity, and it may easily be machined. The heat shield is to be supported by means of blocks of non-conductive refractory material that rest on the supports for the arm chairs, although this detail is omitted in the drawings for the sake of clarity.

The heat shield 40 of the preferred mode is to have a vapor passage 42 similar to and in alignment with the vapor outlet 26 of the container. The wire feed 5 is to pass through the vapor passage 42 as it does the vapor outlet 26. The heat shield of the preferred mode also is to be open on the bottom, as shown at 44, thereby to relieve stress in rapid heating and cooling and also to prevent the accumulation of molten metal that might otherwise occur due to spitting of liquid metal droplets or condensation of metal vapor on the inside surface of the shield, the latter mechanism being the more likely source of the liquid metal. It is anticipated that condensation of metal vapor on the inside surface 46 of the shield will increase the reflectivity of the shield 40, lowering the effective emissivity thereof and thereby reducing heat loss by radiation from the container 20.

From calculations based upon well-established heat-transfer equations, one can calculate that the temperature of the inner surface 46 of the heat shield 40 will be below the boiling point of the evaporant, but above the melting point of the evaporant; such a temperature range will permit a coalescing of condensing metal into droplets at least, thereby to reduce the surface area of this extraneous metal condensate, or, as it is hoped, a film of molten evaporant will form to minimize the surface area as well as to form a heat reflective surface. As metal accumulates in this film, gravity will cause it to ultimately drip off the open bottom 44.

Another advantage accrues from having the heat shield 40 open at the bottom; if the opening is made large enough, then the container 20 can be assembled and properly orientated before the heat shield 40 is installed. Various means may be used for supporting the heat shield, but a universally applicable means would provide electrically insulating support from the same support that provides mechanical support for the "arm chairs" 10.

In the best mode, the heat source for vaporizing the metal in the container is to be an axially-positioned electrical-resistance heating element 50 of a material suitable for the chemical and thermal environment. The material of choice in the best mode is graphite having a protective coating of pyrolytically-deposited boron nitride (BN, the pyrolytically-deposited form being often referred to as PyBN, although this is only a pseudo-chemical notation). The graphite rod is coated over its entire length except for portions near each end (as at 52) where the bare graphite is left exposed for electrical contact therewith. The heating element 50 is passed through holes 54 in the end plugs 23 at each end of the container 20 and gripped in adaptors 56 resting in the standard arm chair for both mechanical and electrical connection. In this best mode, the container 20 receives its mechanical support from this axially located heating element 50 through the end plugs 23.

Almost all of the heat input from this heating element would be transferred by radiation from the incandescing heating element 50 to the inner wall of the container 27 and to the surface of the pool of liquid metal 30. Thus, the metal is largely heated from the top surface of the pool downward to the interface with the wall of the container. This temperature profile, inverted with respect to that existing in the prior art vaporizing boats, is believed to contribute significantly to the reduction of spitting from the liquid metal anticipated to be a result of the use of the present invention.

Referring now to FIG. 2, the arm chair 10 is again present, along with associated electrical cables 12. Supported in each arm chair 10 is a block 55 of an electrically-conductive refractory material, such as graphite, into which is fitted the resistive heating element 50 extending between said blocks 55 and completing an electrical circuit with the power supply (not shown).

In the best mode, the connection between the heating element 50 and the arm chair 10 is effected by using a split block, preferably of graphite, as is shown in FIG. 2. In practicing this mode, the block 55 is first split (as by sawing) and the two pieces 56 57 are held together while a hole to accommodate the heating element 50 is drilled with a hole of a size appropriate for the heating element in line with the split. This practice ensures full contact between the cylindrical heating element 50 and the cylindrical hole thus formed in the block 55.

The block 55 is slipped between the arms of the arm chair 10 with flexible graphite 14 interposed to ensure good electrical contact between the metal arm chair 10 and the block 55.

The amount of open area of the outlet 26, relative to the surface of the pool of molten metal 30, is thought to be an important factor, along with the temperature within the container 20, in effecting a within-the-container vapor pressure that is sufficiently elevated to inhibit the spitting of metal droplets from the pool 30. Whereas in the preferred mode, the heating element 50 is above the metal pool 30, which positioning is though to totally eliminate spitting, the heating element in another mode of this invention is located outside the container, the heat passing through the container wall 28 to the molten metal 30. In the latter case, spitting may be exacerbated, so the size of the vapor outlet 26 is thought to be more important in that embodiment. For aluminum vaporizing applications, an elongated slot having a width of ¼ inch to ⅜ inch appears to have been effective in preliminary testing of this invention.

Figure 3:
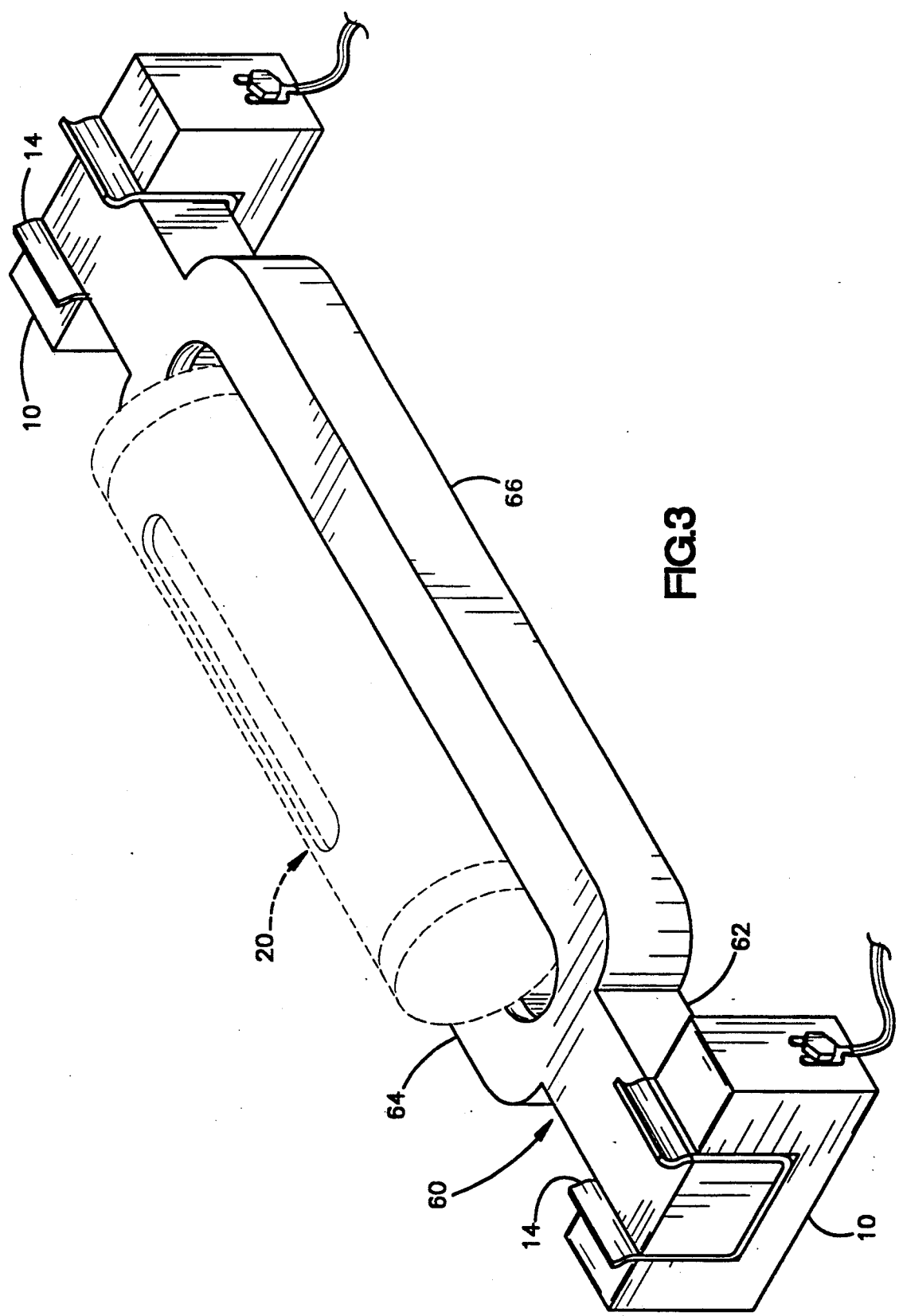
FIG. 3 illustrates a second embodiment of the present invention.

In the aforementioned second embodiment of the invention, illustrated in FIG. 3, the heating element is of the type known in this industry as a "wishbone" (or "tuning fork") 60; that is, a heating element rod 62 extending between the two arm chairs 10 branches in its mid-section into two equal portions 64 66, each of which is intended to carry half of the total current. This heating element might be described as a "medially bifurcated rod." The material to be used for the heating element may be graphite or other materials having suitable electrical and refractory characteristics.

In use, the container of this invention would rest upon the bifurcated portion of the rod 62, being equally supported by each of the two rod sections 64 66. In this manner, heat is transferred into the container 20 primarily by conduction from each of the two rod sections 64 66 and only secondarily from radiation from both rod sections. Thermal input to the container 20 may also be reflected from the thermal radiation shield 40 from the two rod sections 64 66 during the transient period while the temperatures of the various bodies in the system favor such heat transfer.

While I have shown and described only limited principal embodiments in accordance with the present invention, I do not wish to be limited to the details shown and described herein, but intend to cover all such changes and modifications as are encompassed by the scope of the claims appended hereto.

I claim:

1. An evaporation source for use in a source continuous vacuum metal vaporizing process, for providing a metal vapor therefor, said evaporation source comprising:
    a substantially closed container in the shape of a cylinder having an axis, having a refractory cylindrical wall with an inner and an outer surface thereof, and having a first and a second refractory end closure, said container being disposed with said axis thereof substantially in a horizontal orientation and said container adapted by means of having at least one through passage in said wall to allow the passage of a directed beam of said metal vapor;
    said container being adapted to allow the feeding of a substantially continuous metal wire into said container by way of a said at least one through passage, thereby to supply to said container metal that may, when heated sufficiently, melt to form a pool of liquid metal therein and ultimately to vaporize and exit said container by way of a said at least one through passage;
    means to heat said container and said metal to temperatures suitable for converting said metal to a liquid and then to a vapor;
    said means to heat said container being adapted to be held in mechanical and electrical contact in the "arm chair" connections of the prior art, thereby making said evaporation source retrofittable into prior art vapor plating equipment; and
    wherein said wall reduces particulate spatter and extraneous vapor condensation during operation of said evaporation source.

2. The evaporation source of claim 1 with the added feature of having the area of said through passage sufficiently small, of a width of approximately ¼ inch to ⅜ so as to restrict passage of metal vapor, thereby to increase pressure within said container sufficently to effect an increase in the temperature at which spattering of particulate metal begins from said pool of liquid metal.

3. The evaporation source of claim 1 wherein said means to heat said container comprises a resistance heating element positioned axially through said container, passing through close-fitting holes through said first and second end closures and adapted by means of end blocks for mechanical and electrical connection to said "arm chair" connections of the prior art.

4. The evaporation source of claim 3 wherein said resistance heating element comprises a graphite rod.

5. The evaporation source of claim 4 wherein said graphite rod has, on a significant portion thereof, a protective coating of pyrolytically deposited boron nitride (BN).

6. The evaporation source of claim 1 wherein said means to heat said container comprises a medially bifurcated resistance heating element upon which said container rests in direct contact.

7. The evaporation source of claim 6 wherein said resistance heating element is made of graphite.

8. The evaporation source of claim 1 further comprising a thermal radiation shield in the shape of a curved plate surrounding said container and spaced away therefrom, said shield being open on the bottom and having a through passage in registry with said through passage of said container, thereby to partially collimate said beam of metal vapor.

9. The evaporation source of claim 8 wherein the material of said thermal radiation shield is selected from the group consisting of graphite, flexible graphite (i.e., compressed vermicular graphite), silicon nitride, silicon carbide, and titanium diboride.

10. The evaporation source of claim 9 wherein the material of said thermal radiation shield is silicon carbide.

11. The evaporation source of claim 1 wherein the refractory material of said refractory cylinder wall is selected from the group consisting of aluminum nitride, boron nitride, silicon nitride, titanium diboride, and mixtures thereof.

12. The evaporation source of claim 11 wherein the refractory material is titanium diboride.

13. The evaporation source of claim 1 wherein the refractory material of said refractory end closures is aluminum nitride.

14. The evaporation source of claim 1 wherein the refractory material of said refractory end closures is boron nitride.

* * * * *